United States Patent
Schaller et al.

(10) Patent No.: US 8,920,103 B2
(45) Date of Patent: Dec. 30, 2014

(54) MULTI-CELL ROTARY END EFFECTOR MECHANISM WITH SLIP RING

(75) Inventors: Jason Schaller, Austin, TX (US); Robert Vopat, Austin, TX (US)

(73) Assignee: Varian Semiconductor Equipment Associates, Inc., Gloucester, MA (US)

(*) Notice: Subject to any disclaimer, the term of this patent is extended or adjusted under 35 U.S.C. 154(b) by 237 days.

(21) Appl. No.: 13/468,134

(22) Filed: May 10, 2012

(65) Prior Publication Data

US 2013/0302126 A1 Nov. 14, 2013

(51) Int. Cl.
- *B25J 9/10* (2006.01)
- *B25J 15/06* (2006.01)
- *B25J 19/00* (2006.01)
- *H01L 21/677* (2006.01)
- *H01L 21/683* (2006.01)

(52) U.S. Cl.
CPC .............. *B25J 9/10* (2013.01); *B25J 15/0616* (2013.01); *B25J 19/0029* (2013.01); *B25J 19/0041* (2013.01); *H01L 21/67736* (2013.01); *H01L 21/67754* (2013.01); *H01L 21/6838* (2013.01); *Y10S 901/17* (2013.01); *Y10S 901/19* (2013.01)
USPC .......... 414/590; 414/737; 414/752.1; 901/17; 901/19; 318/568.12

(58) Field of Classification Search
CPC .............. B25J 15/0616; B25J 19/0041; B25J 19/0029; H01L 21/67736; H01L 21/6838; H01L 21/67754
USPC ........... 414/737, 589, 590, 752.1; 901/17, 19; 318/568.12; 294/183, 65
See application file for complete search history.

(56) References Cited

U.S. PATENT DOCUMENTS

| | | | |
|---|---|---|---|
| 4,491,173 A * | 1/1985 | Demand | 165/11.1 |
| 5,980,706 A * | 11/1999 | Bleck et al. | 204/297.14 |
| 6,231,428 B1 * | 5/2001 | Maloney et al. | 451/41 |
| 6,851,914 B2 * | 2/2005 | Hirata | 414/752.1 |
| 2010/0226736 A1 | 9/2010 | Borden | |
| 2010/0279439 A1 | 11/2010 | Shah et al. | |
| 2011/0313565 A1 | 12/2011 | Yoo et al. | |

FOREIGN PATENT DOCUMENTS

| | | | | |
|---|---|---|---|---|
| JP | WO 2012039252 A1 * | 3/2012 | | H01L 21/67736 |
| WO | 98/02909 A1 | 1/1998 | | |
| WO | 2012/039252 A1 | 3/2012 | | |

OTHER PUBLICATIONS

International Search Report and Written Opinion mailed Jul. 26, 2013 for PCT/US2013/039102 filed May 1, 2013.

\* cited by examiner

*Primary Examiner* — Gerald McClain (57) ABSTRACT

A rotary end effector for use for the high speed handling of workpieces, such as solar cells, is disclosed. The rotary end effector is capable of infinite rotation. The rotary end effector has a gripper bracket, capable of supporting a plurality of grippers, arranged in any configuration, such as a 4×1 linear array. Each gripper is in communication with a suction system, wherein, in some embodiments, each gripper can be selectively enabled and disabled. Provisions are also made to allow electrical components, such as proximity sensors, to be mounted on the rotating gripper bracket. In another embodiment, an end effector with multiple surfaces, each with a plurality of grippers, is used.

14 Claims, 12 Drawing Sheets

MULTI-CELL ROTARY END EFFECTOR MECHANISM WITH SLIP RING

FIELD

This invention relates to workpiece handling and, more particularly, to multi-cell end effector mechanisms.

BACKGROUND

Ion implantation is a standard technique for introducing conductivity-altering impurities into a workpiece. A desired impurity material is ionized in an ion source, the ions are accelerated to form an ion beam of prescribed energy, and the ion beam is directed at the surface of the workpiece. The energetic ions in the beam penetrate into the bulk of the workpiece material and are embedded into the crystalline lattice of the workpiece material to form a region of desired conductivity.

Ion implantation has been demonstrated as a viable method to dope solar cells. Two concerns of the solar cell manufacturing industry are manufacturing throughput and cell efficiency. Cell efficiency measures the amount of energy converted into electricity. Higher cell efficiencies may be needed to stay competitive in the solar cell manufacturing industry. However, manufacturing throughput cannot be sacrificed in order to increase cell efficiency.

Ion implantation removes process steps used in existing solar cell manufacturing, such as diffusion furnaces. A laser edge isolation step also may be removed if ion implantation is used instead of furnace diffusion because ion implantation will only dope the desired surface. Ion implantation also offers the ability to perform a blanket implant of an entire surface of a solar cell or a selective (or patterned) implant of only part of the solar cell. Selective implantation at high throughputs using ion implantation avoids the costly and time-consuming lithography or patterning steps used for furnace diffusion. Selective implantation also enables new solar cell designs. Furthermore, ion implantation has been used make solar cells with higher cell efficiencies.

Any improvement to manufacturing throughput of an ion implanter or its reliability would be beneficial to solar cell manufacturers worldwide. One such improvement may be the ability to pick up and move multiple workpieces at one time. Therefore, an end effector that is capable of picking up multiple workpieces at once may accelerate the adoption of solar cells as an alternative energy source.

SUMMARY

A rotary end effector for use for the high speed handling of workpieces, such as solar cells, is disclosed. The rotary end effector is capable of infinite rotation. The rotary end effector has a gripper bracket, capable of supporting a plurality of grippers, arranged in any configuration, such as a 4×1 linear array. Each gripper is in communication with a suction system, wherein, in some embodiments, each gripper can be selectively enabled and disabled. Provisions are also made to allow electrical components, such as proximity sensors, to be mounted on the rotating gripper bracket. In another embodiment, an end effector with multiple surfaces, each with a plurality of grippers, is used.

BRIEF DESCRIPTION OF THE DRAWINGS

For a better understanding of the present disclosure, reference is made to the accompanying drawings, which are incorporated herein by reference and in which.

DETAILED DESCRIPTION

The workpiece handling system herein is described in connection with solar cells. However, the embodiments can be used with other workpieces such as semiconductor wafers, light emitting diodes (LEDs), silicon-on-insulator (SOI) wafers, or other devices. The workpiece handling system can be used with ion implanters or with other processing equipment like deposition, etching, or other workpiece processing systems. Thus, the invention is not limited to the specific embodiments described below.

Figure 1:
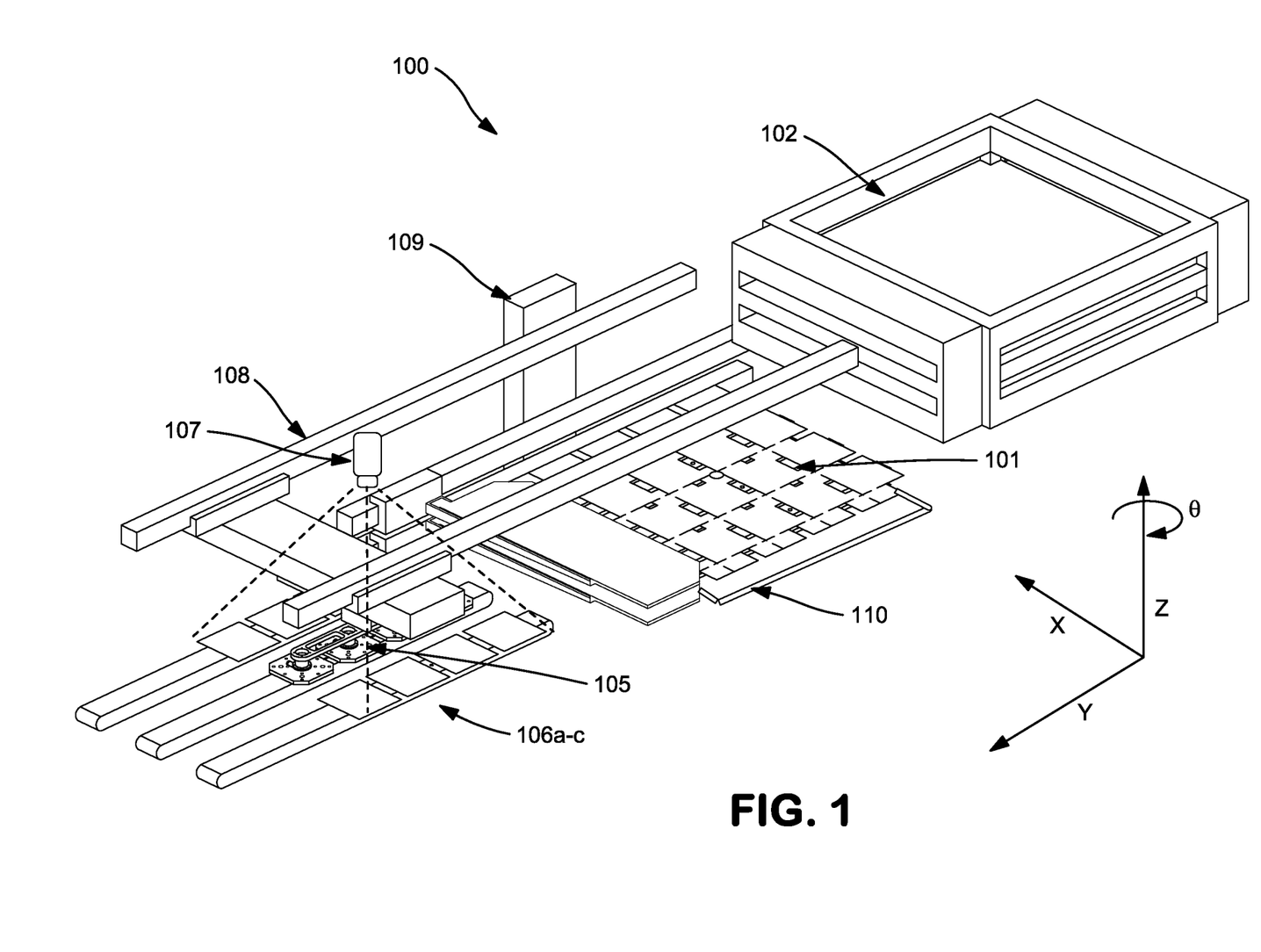
FIG. 1 is a perspective view of a first embodiment of a workpiece handling system.
Figure 2:
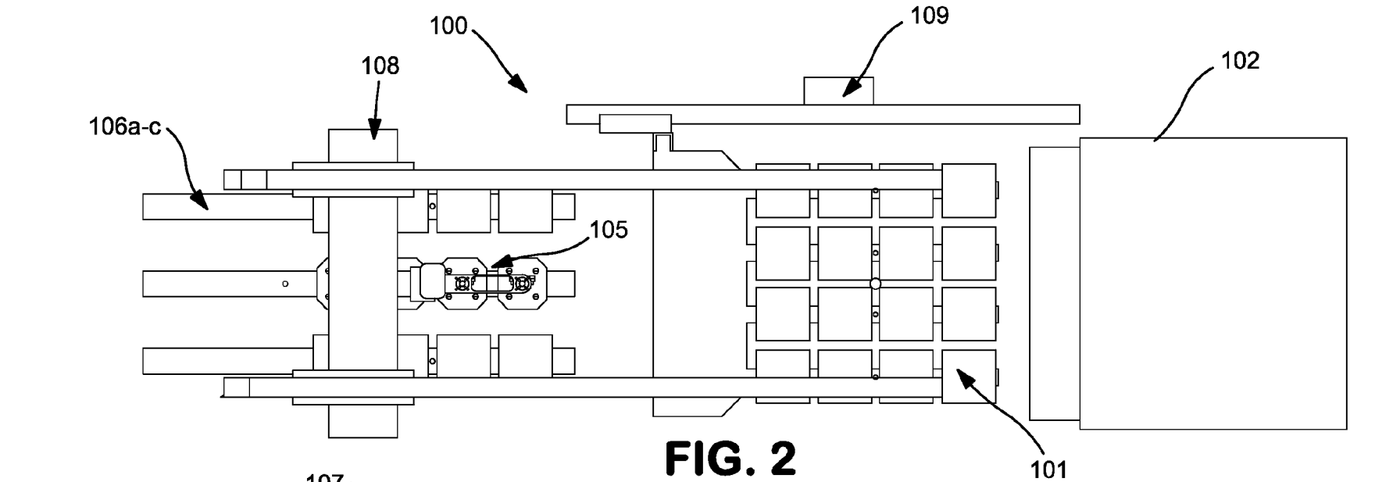
FIG. 2 is a top perspective view of the first embodiment of a workpiece handling system illustrated in FIG. 1.
Figure 3:
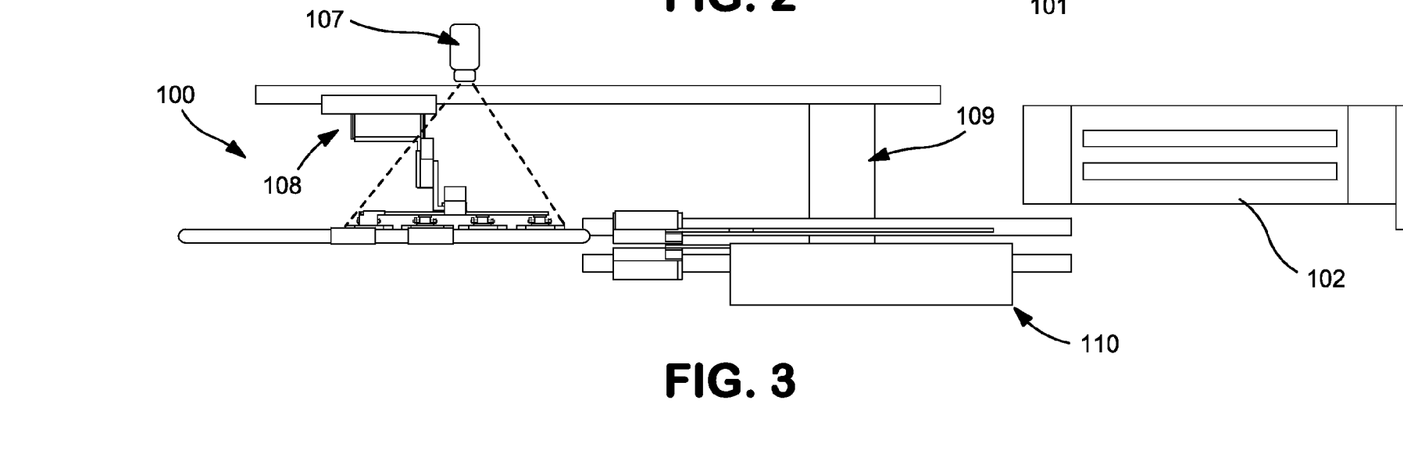
FIG. 3 is a side perspective view of the first embodiment of a workpiece handling system illustrated in FIG. 1.

The exemplary workpiece handling system 100 illustrated in FIGS. 1-3 may be capable of processing greater than 2000 wafers per hour (wph) using a 4×4 matrix of workpieces. Of course, other workpiece matrix designs may be used and the embodiments herein are not limited merely to a 4×4 matrix. These figures represent the workpiece handling system, the individual components of which will be described in more detail below. FIG. 1 shows a perspective view of the belt modules, gantry module, matrix, build station, swapbot and load locks. FIGS. 2 and 3 show a top view and side view of these components, respectively.

This matrix 101 of workpieces may be placed in a carrier that has individual slots or depressions to hold workpieces. In an alternate embodiment, no carrier is used for the workpieces. The matrix 101 instead is handled by robots or other means before and during processing. The matrix 101 in this instance may be held on an electrostatic or mechanical clamp, or by gravity.

This workpiece handling system 100 transfers workpieces from a cassette or other interface, builds the matrix 101, and moves the matrix 101 into the load lock 102. The reverse process also may be performed by the workpiece handling system 100 to transfer workpieces back to the cassette or other interface. The load lock 102 is connected to an ion implanter or some other processing tool.

In this embodiment, three belt modules 106a-c may transport the workpieces from the cassette. The transport of the workpieces may be performed at a specified speed, interval, or pitch. A robot may be used to place the workpieces onto the belt modules 106a-c. At the end of the belt modules 106a-c, a camera 107 and a controller will determine the position of each of the workpieces and will determine if the position or orientation of the workpieces needs to be corrected during the transfer to the matrix 101. More or less than three belt modules 106a-c may be used in other embodiments. Each of these belt modules 106a-c may be designated for load or unload of workpieces or may be used for both loading and unloading.

A gantry module 108 picks workpieces from the belt modules 106a-c and builds the matrix 101, such as using electrostatic, mechanical, or vacuum forces. The gantry module 108 may move in three-dimensions and may also achieve rotational motion. This gantry module 108 may use information from the camera 107 and controller to correct the position or orientation of the workpieces. The gantry module 108 also may remove workpieces from the matrix 101 to places onto the belt modules 106a-c for transfer back to the cassette or other interface.

The gantry module 108 may have at least one y-axis actuator, one x-axis actuator, one z-axis actuator, and a tilt, or rotational, actuator. This provides four degrees of freedom and enables pick-and-place operation. The gantry module 108 can correct the workpieces in the x, y, and θ (tilt) directions. The gantry module 108 also can transport the workpieces from any of the belt modules 106a-c to any of the positions in the matrix 101. Rotation or tilting in the θ direction may be performed by the gantry module 108.

In an alternate embodiment, the gantry module 108 can skip or not place "bad" workpieces. These "bad" workpieces may be damaged or broken. The gantry module 108 also may compensate for "missing" workpieces that may not have properly loaded onto the belt modules 106a-c. The camera 107 and a processor may be used to assist the gantry module 108 in this regard.

The end effector 105 of the gantry module 108 is a multi-gripper design that may be a smaller version of the matrix 101. Thus, while the matrix 101 may be 4×4 workpieces, the gantry module 108 may be 1×4 or some other design. The workpieces may be corrected by the gantry module 108 either individually or as a 1×4 group.

In one embodiment of operation, the gantry module 108 will take four workpieces that have been processed and place these on one of the belt modules 106a-c. The gantry module then takes four unprocessed workpieces from the belt modules 106a-c and places these in the matrix 101. This reduces the amount of travel time and the time that the gantry module 108 is not transporting workpieces. The unprocessed workpieces are placed in the matrix 101 where the previously processed workpieces were removed from. This process may be repeated and the combined load and unload of the matrix 101 by the gantry module 108 may be used for the entire matrix 101.

A swap module 109 (using at least one "swap robot" or "swapbot") may be used to place the matrix 101 into the load lock 102. This swap module 109 may be a linear actuator. There may be one or more than one swap robots in the swap module 109. These may, for example, hold an empty carrier and a full carrier. One swap robot may be parked out of the way during loading and unloading. Each swap robot may have a z-axis actuator and one or more y-axis actuators for each of the blades. The first swap robot may pick up unprocessed workpieces in the matrix 101 from the build station 110 and the second swap robot may extend into the load lock 102 to pick up processed workpieces. The processed workpieces are removed from the load lock 102 and the unprocessed workpieces are placed in the load lock 102. The processed workpieces are returned to the build station for unloading while the unprocessed workpieces are implanted or otherwise processed.

The building of the matrix 101 may be coordinated with the pumping down or venting of the load lock 102. This may increase throughput of the system attached to the load lock 102, such as an ion implanter.

Figure 4:
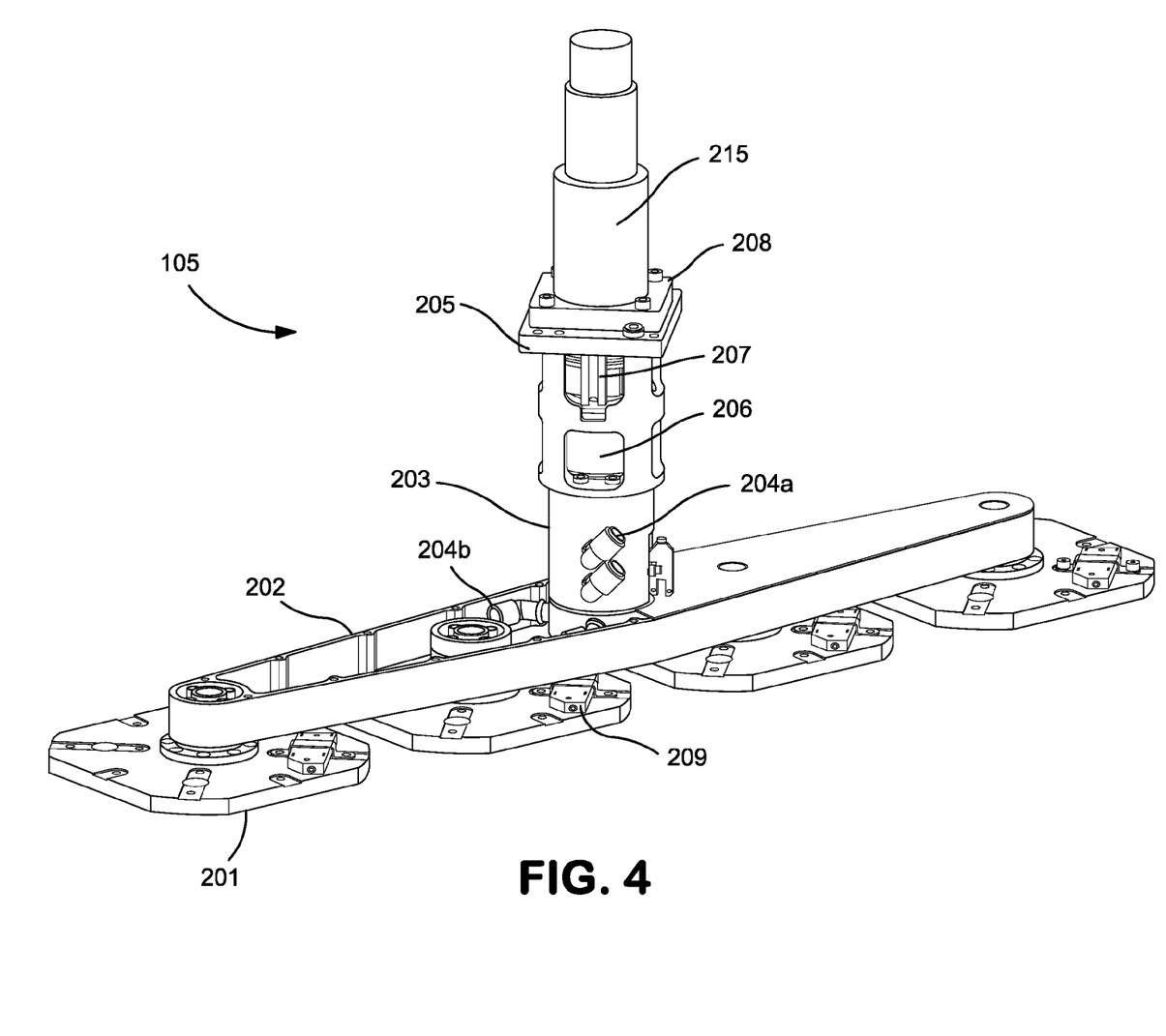
FIG. 4 is an end effector in accordance with one embodiment.
Figure 5:
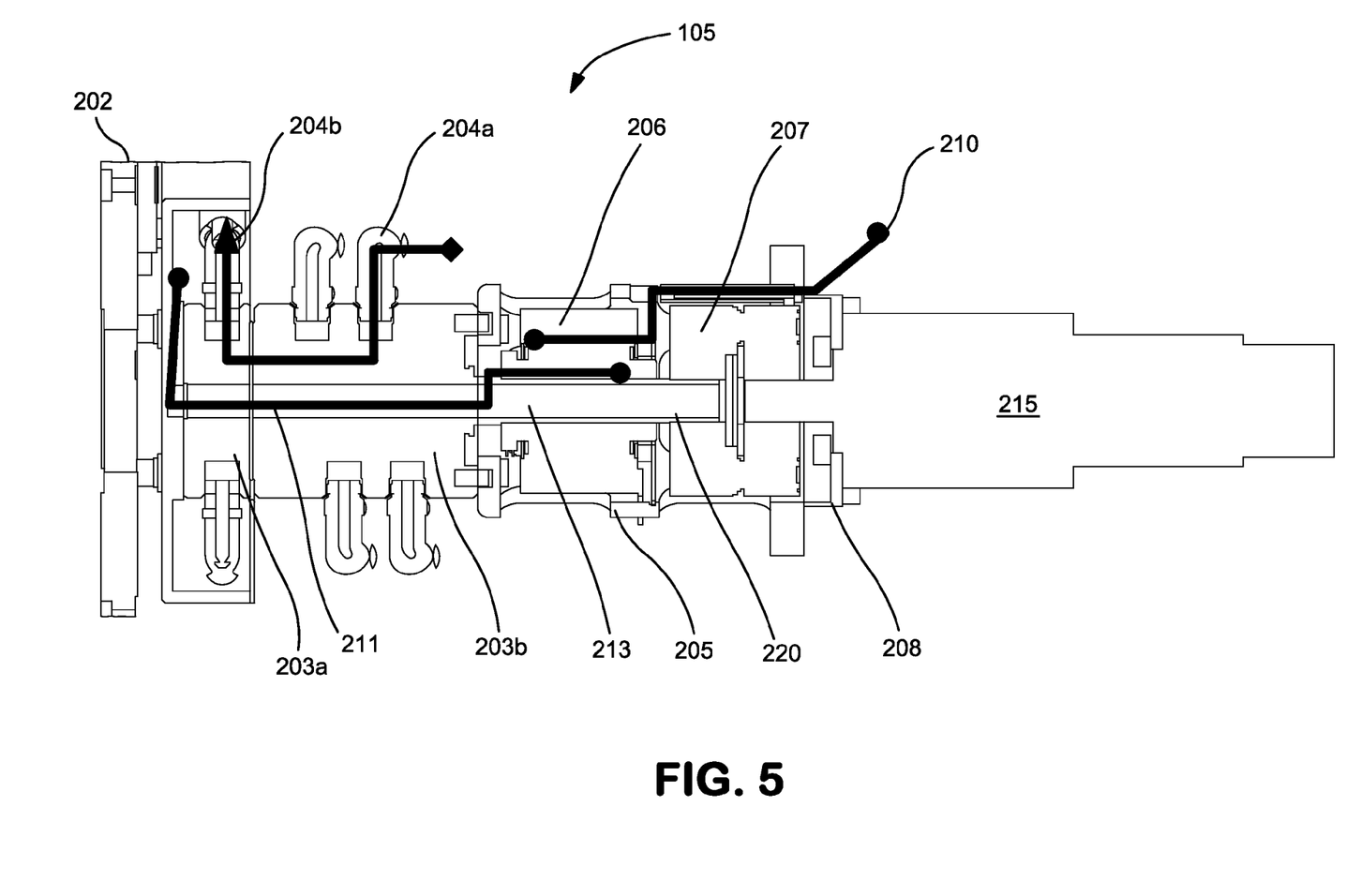
FIG. 5 is a cross-section of the end effector of FIG. 4.

FIG. 4 is an enlarged version of end effector 105 for the gantry module 108, while FIG. 5 is a cross-section of end effector 105. As described above, the end effector 105 allows rotational movement about an axis perpendicular to the carrier 101. It also allows gripping of a multiple number of workpieces at one time. The embodiment of FIG. 4 shows an end effector 105 with four grippers 201, although any number of grippers can be accommodated. The grippers 201 are all mounted to a gripper bracket 202. In some embodiments, the gripper bracket 202 includes an interior cavity 203. This interior cavity 203 may be used to route any necessary fluid or electrical conduits. For example, in some embodiments, the grippers 201 are each in communication with a tube or other fluid conduit which interfaces with a suction system, thereby allowing the gripper 201 to pick up and hold a workpiece. Similarly, there may be one or more electrical components attached to the gripper bracket 202 which require electrical contacts. Examples of such components include proximity sensors 209 or cameras, although other components may also be included.

Figure 6:
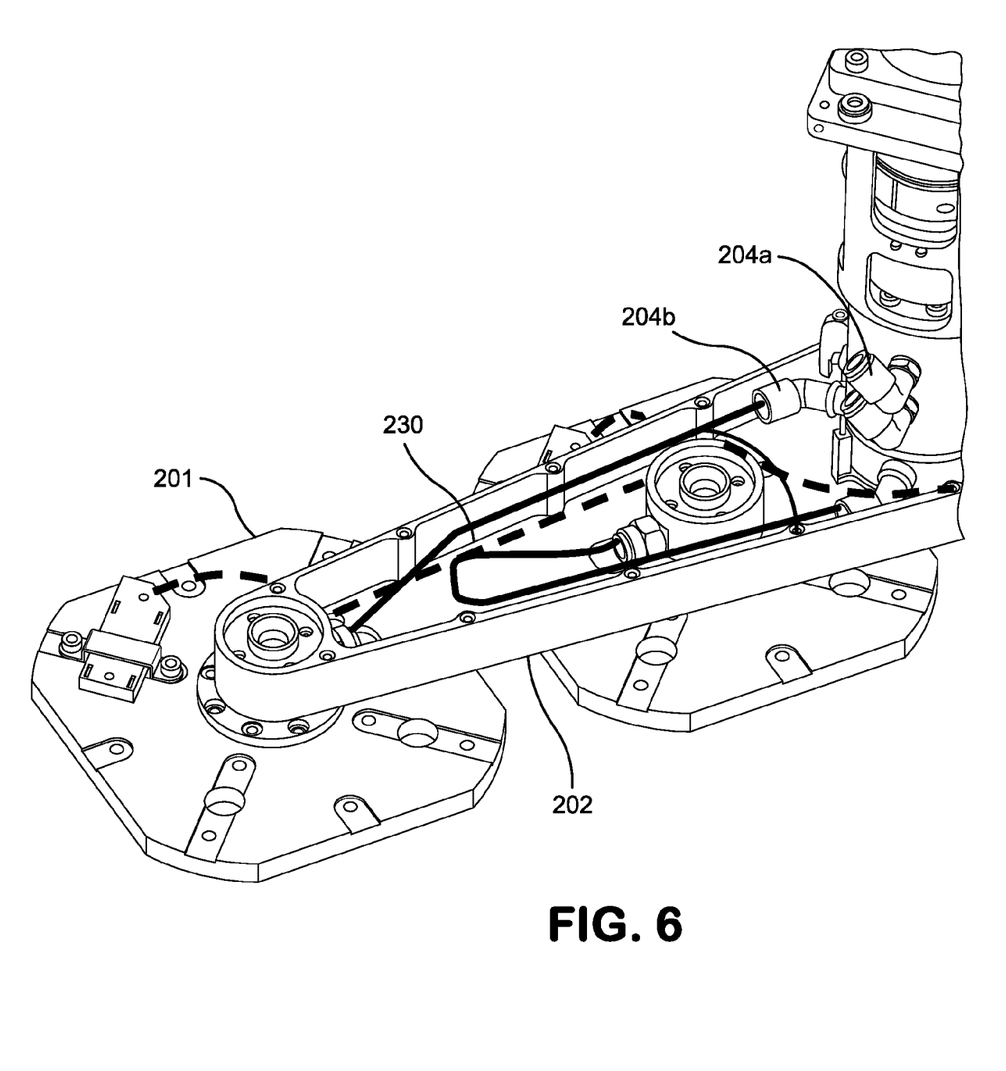
FIG. 6 is a view of the interior of the gripper bracket in the end effector of FIGS. 4 and 5.

Attached to the gripper bracket 202 is a rotary union 203. The rotary union 203 is used to connect one or more stationary or fixed fluid connectors 204a to rotating fluid connectors 204b. In this embodiment, the rotary union 203 has two portions, a rotating portion 203a, which moves with the gripper bracket 202 and includes the rotating fluid connectors 204b, and a stationary portion 203b, which remains fixed and includes the stationary fluid connectors 204a. Embedded within the rotary union 203 are conduits that serve to connect each of the stationary connectors 204a to a respective rotating connector 204b. In operation, the suction system is attached to the stationary fluid connectors 204a. The stationary fluid connectors 204a are in communication with the rotating fluid connectors 204b through the conduits embedded in the rotary union. As seen in FIG. 6, conduits 230 connect each of the rotating fluid connectors 204b to a respective gripper 201.

The rotating portion 203a of the rotary union 203 is rigidly affixed to the gripper bracket 202. This rotating portion 203a is the drive element for the gripper bracket 202. In other words, it is the rotation of the rotating portion 203a that causes the gripper bracket 202 to spin.

Above the rotary union 203 is a housing 205, which holds the slip ring 206 and rotary coupling 207. The housing 205 is attached to the motor mount flange 208 and serves to protect and hold the components in it. The slip ring 206 is a device that allows electrical connections to be made to a rotating device. Electrical connections, such as wires or cables 210, are attached to the exterior of the slip ring 206 and are rigidly attached. A set of conductive rings is used to pass these signals to the interior of the rings, where the wires 211 travel through the bore 213 within the device to the gripper bracket 202. In other words, a set of wires 210 may be connected to the fixed exterior portion of the slip ring 206. A corresponding set of wires 211 exits the rotating interior portion of the slip ring 206, where each wire 210 connected to the fixed exterior portion is in communication with a respective one of the wires 211 exiting the rotating interior portion of the slip ring 206.

In some embodiments, a plurality of wires 211, for example six wires, are transmitted to the gripper bracket 202, although any number of wires 211 is envisioned. These wires 211 can be used to bring power, ground or data to components mounted on the gripper bracket 202.

A rotary coupling 207 is used to couple the rotary actuator 215 to a shaft 220. This shaft 220 provides the means for the gripper bracket 202 to rotate. The shaft 220 may be hollow and have one or more opening from its exterior to its interior. In one embodiment, the wires 211 from the slip ring 206 pass through these openings and pass down the shaft 220 to the gripper bracket 202. In this embodiment, the slip ring 206 rotates with the gripper bracket 202 such that there is no relative motion between the second shaft 220 and the wires 211.

Note that the slip ring 206 and the rotary union 203 both contain a bore therethrough to allow the shaft 220 to pass from the rotary coupling 207 to the rotating portion 203a of the rotary union 203. The rotator actuator 215 may be a 50:1 harmonic gear box coupled to a servo motor, although other rotator actuators may be used.

Figure 10:
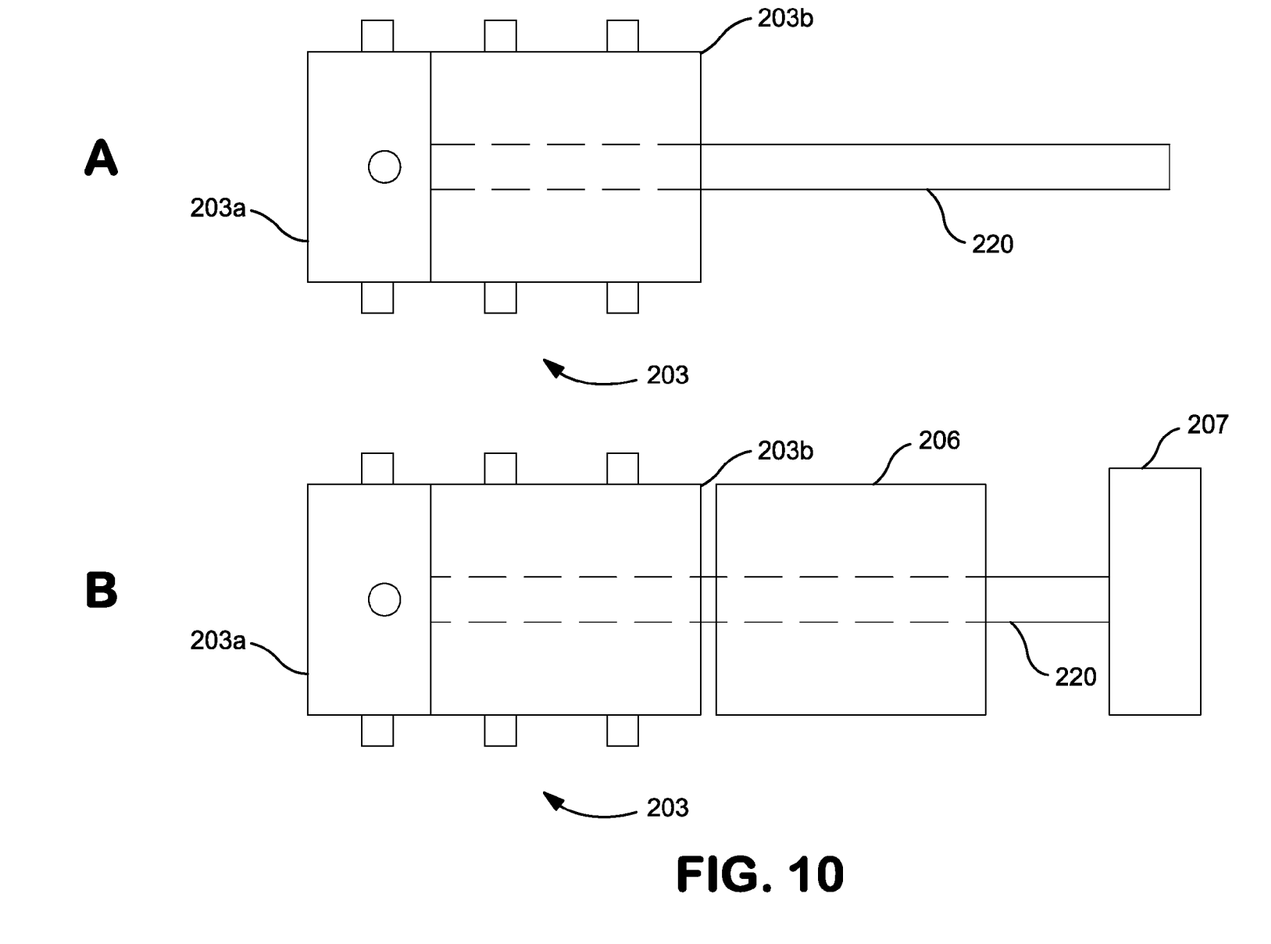
FIGS. 10A-B show a rotary union used in one embodiment.

In one embodiment, shown in FIGS. 10A-B, the shaft 220 is an integral part of the rotary union 203. In this embodiment, the shaft 220 is affixed to an internal portion of the rotating portion 203a and extends through the bore in the fixed portion 203b, extending a predetermined length beyond the rotary union 203. This extended length allows the slip ring 206 to slide over the shaft 220, as shown in FIG. 10B. This extended length then contacts the rotary coupling 207, where it is affixed thereto. In another embodiment, the shaft 200 is a separate component that is affixed to the rotary coupling 207 on one end and the rotating portion 203b of the rotary union 203 on its opposite end.

This configuration is capable of infinite rotation while providing high torque. It also allows a plurality of grippers 201 to be placed on the gripper bracket 202, each of which may be independently controlled. In the embodiment of FIG. 4, the grippers are arranged in a 4×1 linear matrix. However, other configurations are also possible and within the scope of the disclosure. For example, the linear array may be larger than 4×1. In other embodiments, the array is not linear, such as a 2×2 matrix. The rotation of this end effector is about an axis that is perpendicular to the plane in which the grippers 201 lie.

Figure 7:
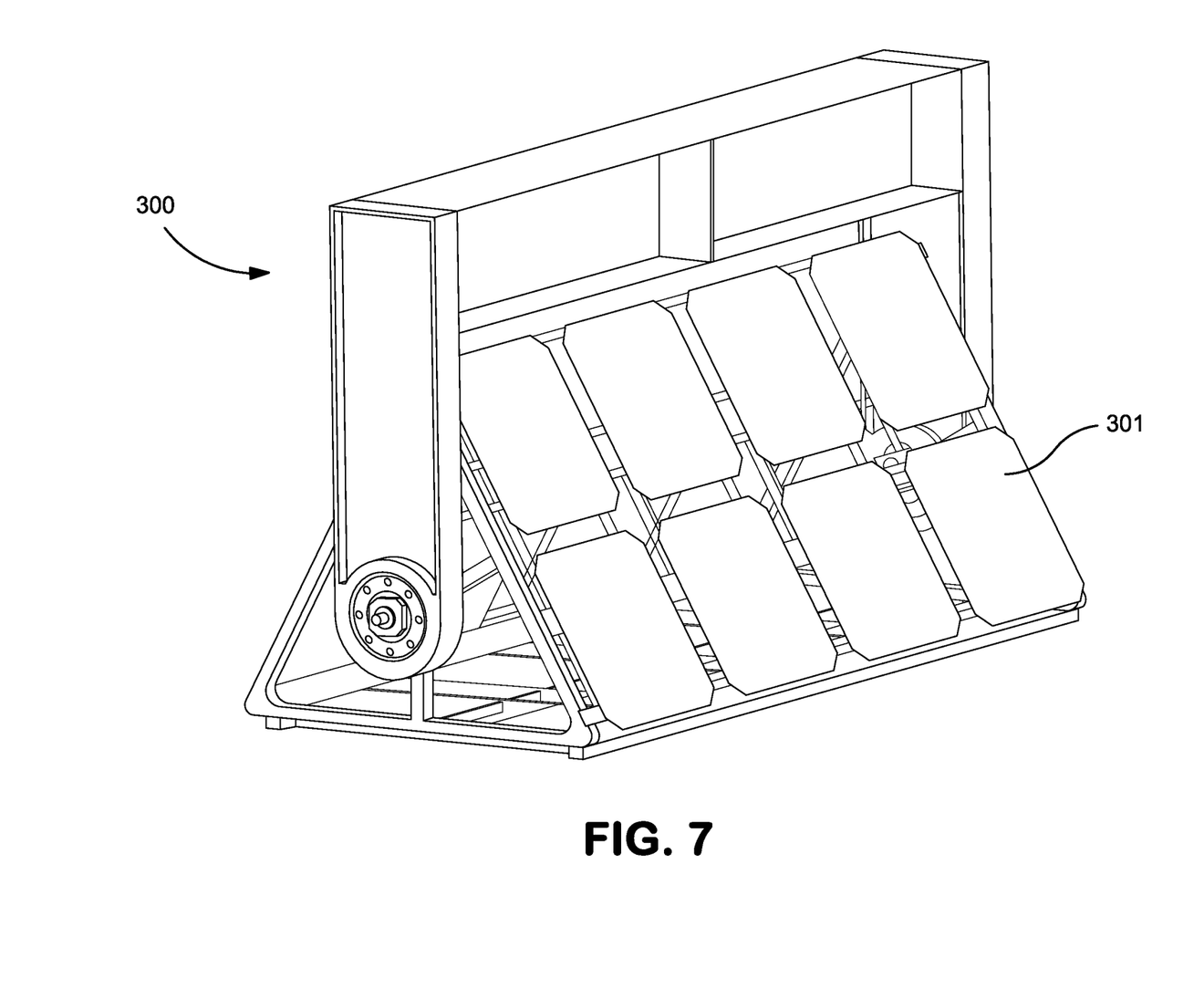
FIG. 7 is an end effector in accordance with a second embodiment.

In another embodiment, a different end effector may be used. FIG. 7 shows an end effector 300 having a plurality of surfaces 310, each having a plurality of grippers 301. Each of these grippers 301 may be connected to a suction system, similar to that described above. In some embodiments, the suction system for each gripper may be actuated independently of the other grippers. In other embodiments, one or more grippers share a common suction system and are enabled as a unit. Each gripper 301 is therefore connected to a conduit in communication with a suction system. The end effector 300 may also have a rotary union and a slip ring, such as those described in connection with FIG. 5. These components would minimize the twisting of the fluid and electrical connections between the grippers 301 and the rest of the system. However, in other embodiments, the end effector 300, unlike that of FIG. 5, is not capable of full 360° rotation. In this embodiment, the fluid and electrical connections may be allowed to turn, since there is a limit to the amount of twist that they would be subjected to. Therefore, in this embodiment, there may not be a rotary union or a slip ring. Unlike the previous embodiment, this end effector 300 rotates about an axis that is parallel to the plane in which the grippers 301 lie. This axis of rotation allows different sides of the end effector 300 to be brought into contact with the workpieces.

The end effector 300 of FIG. 7 has a plurality of sides, where each side has one or more grippers 301. In one embodiment, there are M+1 sides, where each of these sides has N grippers. This end effector 300 operates in conjunction with a carrier used to hold the workpieces, which holds M*N workpieces. As an example, if the carrier held 16 workpieces, organized as a 4×4 matrix, the end effector 300 may have 3 sides, each with 8 grippers, as shown in FIG. 7.

Figure 9:
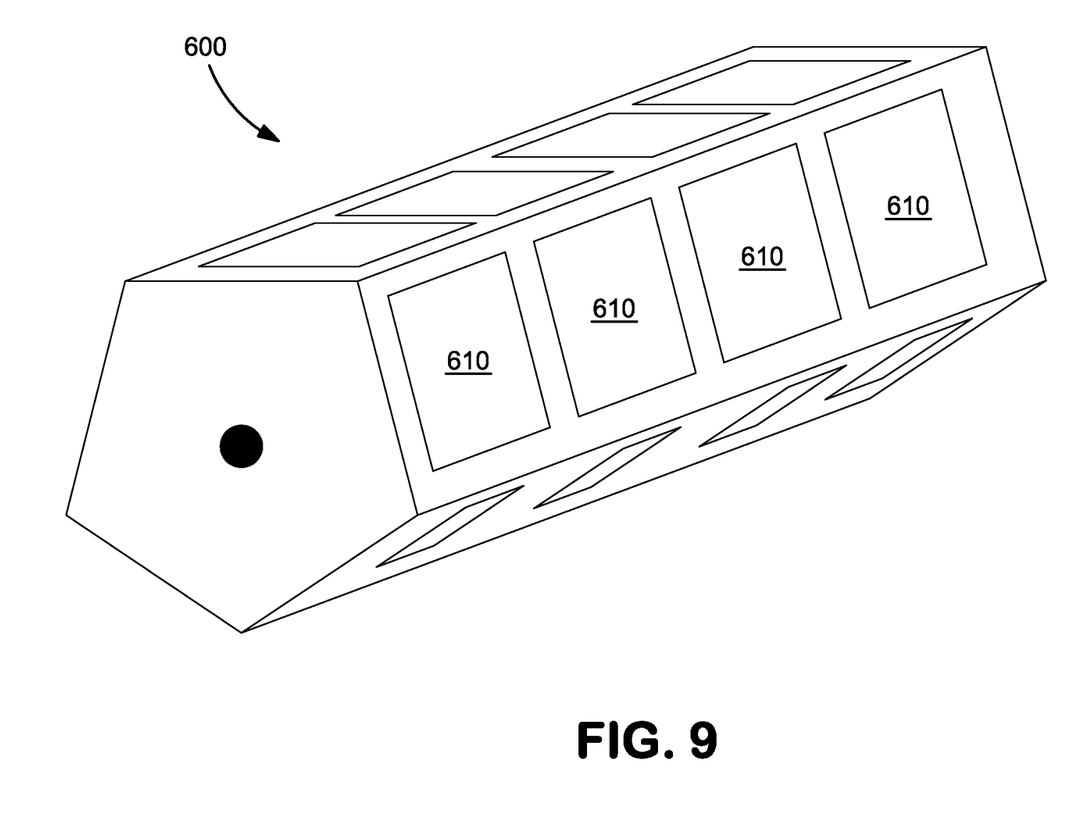
FIG. 9 is an end effector in accordance with another embodiment.

In another embodiment, the end effector 600 may have 5 sides, each with 4 grippers 610, as shown in FIG. 9. In this embodiment, all of the workpieces on the carrier can be held by 4 of the sides of the end effector 600. This allows one side to be used for another purpose. In other words, the inclusion of one additional side allows for the simultaneous loading and unloading of workpieces.

Figure 8:
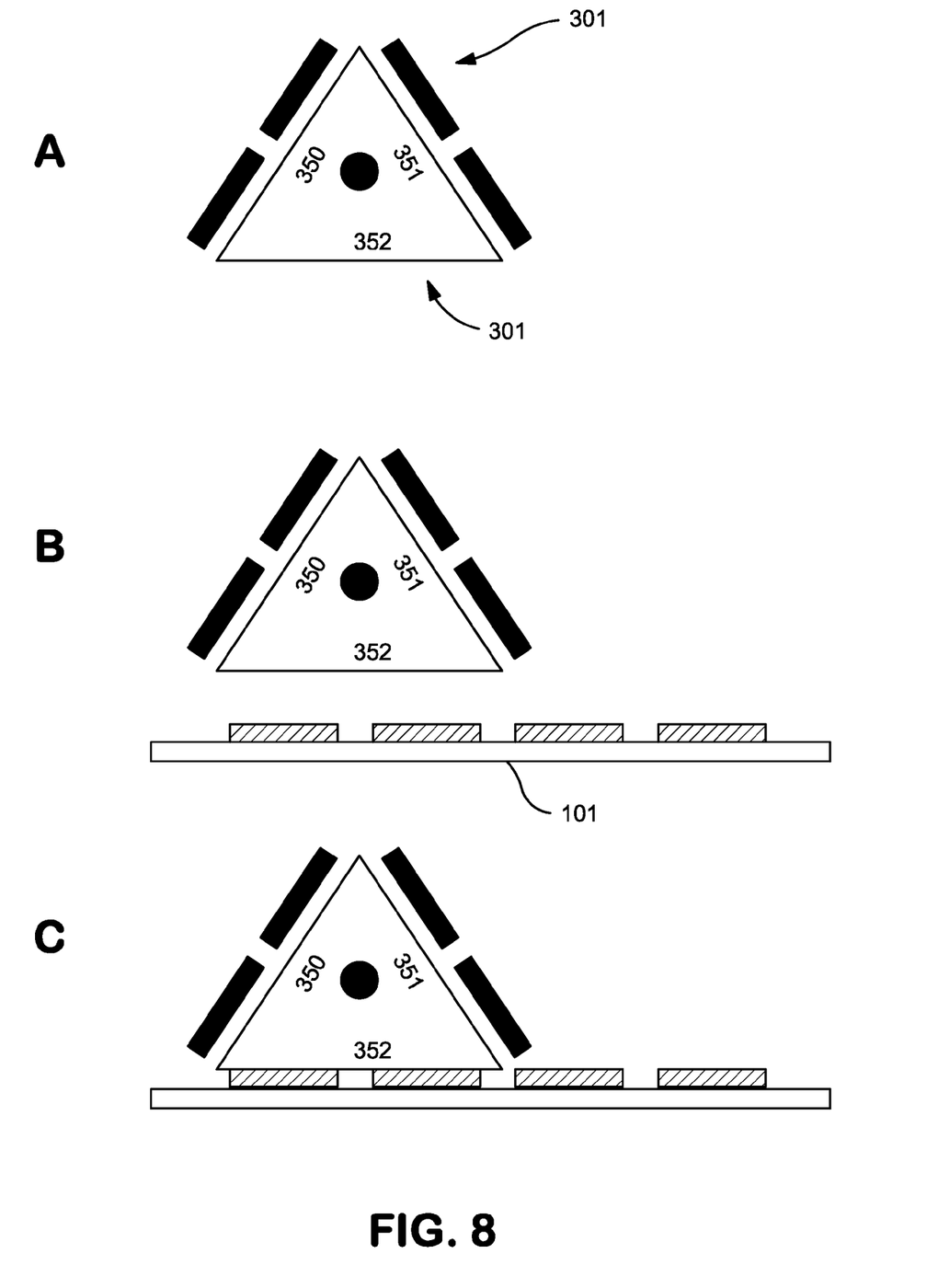
FIGS. 8A-L illustrate a sequence of loading and unloading workpieces using the end effector of FIG. 7.

FIG. 8A-L shows an example using an end effector having 3 sides, each having 8 grippers 301. As stated previously, other configurations of the end effector are possible. In FIG. 8A, an end effector 300 is loaded with unprocessed workpieces on two of its sides. Assuming the configuration of FIG. 7, there are 8 unprocessed workpieces on side 350 and 8 unprocessed workpieces on side 351. Side 352 is empty at this time.

In FIG. 8B, the end effector 300 is moved to a carrier 101, where the carrier 101 contains, for instance, 16 processed workpieces, organized in 4 rows with 4 workpieces in each row. In FIG. 8C, the end effector 300 is lowered, so that the unpopulated side 352 is atop two rows of processed workpieces. In FIG. 8D, the suction system associated with side 352 is enabled, and the grippers 301 on the side 352 pick up the processed workpieces from the carrier 101. The end effector 300 is then moved in the vertical direction. In FIG. 8E, the end effector 300 has been rotated 120° to move a different side 351 over the carrier 101. The amount of rotation is defined as 360°/(number of sides). After the end effector 300 has been rotated, it is moved vertically downward, as shown in FIG. 8F, so that the unprocessed workpieces on side 351 are placed on the carrier 101. The suction system associated with side 351 is then disabled, which releases the unprocessed workpieces from the grippers 301.

The end effector 300 is then moved vertically, as shown in FIG. 8G. The end effector is then moved horizontally to the other processed workpieces in the carrier 101, as shown in FIG. 8H. The end effector is then lowered, so that the side 351 is in contact, or near contact, with processed workpieces, as shown in FIG. 8I. The suction system associated with side 351 is then enabled, thereby picking up the processed workpieces from the carrier 101, as shown in FIG. 8J. The end effector 300 is moved vertically, allowing sufficient space so that the end effector 300 can rotate 120°, as shown in FIG. 8K. The end effector 300 is then lowered so that the unprocessed workpieces on side 350 can be placed on the carrier 101, as shown in FIG. 8L. The suction system associated with side 350 is then disabled, thereby releasing the unprocessed workpieces onto the carrier 101.

The end effector 300 now has 16 processed workpieces. It is then moved to another location where it unloads these processed workpieces and picks up 16 more unprocessed workpieces, using this process. The sequence illustrated above moves the end effector in a clockwise direction. In some embodiments, such as when rotary unions and slip rings are not used, a subsequent process is performed by moving the end effector 300 in a counterclockwise direction.

A similar process is performed using the end effector 600 of FIG. 9. In this embodiment, the end effector 600 must be rotated 5 times to allow for the loading and unloading of 16 workpieces. In other words, the steps shown in FIGS. 8E-J would be performed two additional times in order to move workpieces to and from all 5 sides.

In some embodiments, the end effector 300 of FIG. 7 is used in lieu of the end effector 200 shown in FIG. 4. In this embodiment, the gantry module 108 is used to move and control the end effector 300.

In another embodiment, the end effector 300 of FIG. 7 may be used in conjunction with a different actuator. In this embodiment, this actuator may replace the gantry module 108 and swap module 109 of FIG. 1. This actuator may move unprocessed workpieces directly from a conveyor belt modules 106a-c to the load lock 102. As described earlier, the end effector 300 may pick up enough unprocessed workpieces from the conveyor 106a-c to fill an entire carrier 101. In other embodiments, a carrier may not be used and the end effector 300 may move the unprocessed workpieces directly to the lower surface of the load lock 102. After picking up the required number of unprocessed workpieces, the end effector 300 is moved to the load lock 102 by the actuator. It then places the unprocessed workpieces in the load lock 102 and picks up processed workpieces, as described in conjunction with FIG. 8.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. These other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An end effector for use in a workpiece handling system, comprising:
    a plurality of grippers, each of said grippers in communication with a respective fluid conduit adapted to interface to a suction system;
    a rotatable bracket holding said grippers;
    a rotary union, comprising a first fixed portion having a plurality of stationary connectors and a rotating portion having a corresponding plurality of rotating connectors, wherein each of said stationary connectors is in communication with a respective one of said rotating connectors through a respective conduit within said rotary union, wherein each of said rotating connectors are attached to a respective fluid conduit and wherein said rotating portion is affixed to said rotatable bracket;
    a slip ring, comprising a fixed exterior portion to which a first wire is connected and a rotating inner portion from which a second wire exits, wherein said first wire and said second wire are in communication with each other via said slip ring;
    a rotary actuator, positioned such that said slip ring is located between said rotary actuator and said rotary union; and
    a shaft, said shaft coupling said rotary actuator to said rotating portion, wherein said slip ring and said rotary union each comprise an interior bore through which said shaft passes, and said slip ring and said rotary union are disposed between said rotary actuator and said rotatable bracket.

2. The end effector of claim 1, wherein said shaft comprises an inner bore and said second wire passes through said inner bore.

3. The end effector of claim 1, wherein said grippers are arranged on said gripper bracket in a linear array.

4. The end effector of claim 3, further comprising four grippers.

5. The end effector of claim 1, wherein said shaft is integral with said rotary union and said shaft extends from said rotating portion of said rotary union.

6. The end effector of claim 5, further comprising a rotary coupling to couple said rotary actuator and said shaft, and wherein said slip ring is positioned on said shaft between said rotary union and said rotary coupling.

7. A workpiece handling system, comprising a gantry module for moving a plurality of workpieces from a first location to a second location, said gantry module comprising:
    an end effector for picking up said workpieces;
    a first actuator to move said end effector in an X direction;
    a second actuator to move said end effector in a Y direction;
    a third actuator to move said end effector in a Z direction;
    wherein said end effector comprises:
        a plurality of grippers, each of said grippers in communication with a respective fluid conduit adapted to interface to a suction system;
        a rotatable bracket holding said grippers;
        a rotary union, comprising a first fixed portion having a plurality of stationary connectors and a rotating portion having a corresponding plurality of rotating connectors, wherein each of said stationary connectors is in communication with a respective one of said rotating connectors through a respective conduit within said rotary union, wherein each of said rotating connectors are attached to a respective fluid conduit and wherein said rotating portion is affixed to said rotatable bracket;
        a slip ring, comprising a fixed exterior portion to which a first wire is connected and a rotating inner portion from which a second wire exits, wherein said first wire and said second wire are in communication with each other via said slip ring;
        a rotary actuator, positioned such that said slip ring is located between said rotary actuator and said rotary union; and
        a shaft, said shaft coupling said rotary actuator to said rotating portion, wherein said slip ring and said rotary union each comprise an interior bore through which said shaft passes, and said slip ring and said rotary union are disposed between said rotary actuator and said rotatable bracket.

8. The workpiece handling system of claim 7, wherein said shaft is integral with said rotary union and said shaft extends from said rotating portion of said rotary union.

9. The workpiece handling system of claim 8, further comprising a rotary coupling to couple said rotary actuator and said shaft, and wherein said slip ring is positioned on said shaft between said rotary union and said rotary coupling.

10. The workpiece handling system of claim 7, further comprising an electrical component located on said rotatable bracket, said electrical component in communication with said second wire.

11. A workpiece handling system, comprising a gantry module for moving a plurality of workpieces from a first location to a second location, said gantry module comprising:
    an end effector for picking up said workpieces;
    a first actuator to move said end effector in an X direction;
    a second actuator to move said end effector in a Y direction;
    a third actuator to move said end effector in a Z direction;
    wherein said end effector comprises:
        a linear array of four grippers, each of said grippers in communication with a respective fluid conduit adapted to interface to a suction system;
        a rotatable bracket holding said linear array of grippers;
        a rotary union, comprising a first fixed portion having four stationary connectors and a rotating portion having a corresponding number of rotating connectors, wherein each of said stationary connectors is in communication with a respective one of said rotating connectors through a respective conduit within said rotary union, wherein each of said rotating connectors are attached to a respective fluid conduit and wherein said rotating portion is affixed to said rotatable bracket;

a slip ring, comprising a fixed exterior portion to which a first wire is connected and a rotating inner portion from which a second wire exits, wherein said first wire and said second wire are in communication with each other via said slip ring;

a rotary actuator, positioned such that said slip ring is located between said rotary actuator and said rotary union; and a shaft, said shaft coupling said rotary actuator to said rotating portion, wherein said slip ring and said rotary union each comprise an interior bore through which said shaft passes, and said slip ring and said rotary union are disposed between said rotary actuator and said rotatable bracket.

12. The workpiece handling system of claim 11, wherein said shaft is integral with said rotary union and said shaft extends from said rotating portion of said rotary union.

13. The workpiece handling system of claim 12, further comprising a rotary coupling to couple said rotary actuator and said shaft, and wherein said slip ring is positioned on said shaft between said rotary union and said rotary coupling.

14. The workpiece handling system of claim 11, further comprising an electrical component located on said rotatable bracket, said electrical component in communication with said second wire.

* * * * *